US006559649B2

(12) United States Patent
Deleu et al.

(10) Patent No.: US 6,559,649 B2
(45) Date of Patent: May 6, 2003

(54) CONNECTOR ASSEMBLY TO ELIMINATE OR REDUCE ESD ON HIGH-SPEED COMMUNICATION CABLES

(75) Inventors: Edward W. Deleu, Fair Lawn, NJ (US); Min-Chung Jon, Princeton Junction, NJ (US); Vito Palazzo, Hamilton Township, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/906,192

(22) Filed: Jul. 16, 2001

(65) Prior Publication Data

US 2003/0011375 A1 Jan. 16, 2003

(51) Int. Cl.[7] .............................. G01R 29/12

(52) U.S. Cl. .............................. 324/457; 324/538; 439/181

(58) Field of Search .............................. 439/92, 354, 181; 324/457, 538, 539, 541

(56) References Cited

U.S. PATENT DOCUMENTS

| | | | |
|---|---|---|---|
| 4,814,698 A | | 3/1989 | St. Onge et al. |
| 5,018,989 A | | 5/1991 | Black et al. |
| 5,066,240 A | | 11/1991 | Verdun |
| 5,409,387 A | | 4/1995 | Northey et al. |
| 5,478,253 A | | 12/1995 | Biechler et al. |
| 6,074,222 A | * | 6/2000 | Kuo .............. 439/92 |
| 6,179,627 B1 | * | 1/2001 | Daly et al. .............. 439/354 |
| 6,217,382 B1 | | 4/2001 | Ziers |

* cited by examiner

*Primary Examiner*—N. Le
*Assistant Examiner*—Vincent Q. Nguyen
(74) *Attorney, Agent, or Firm*—Woodbridge & Associates, PC; Richard C. Woodbridge, Esq.

(57) ABSTRACT

A connector assembly for removing static electricity generated in high-speed communication cable as a result of tribocharging is described. The invention is realized with a typical high-speed cable having a connector provided with a dissipative medium and at least one conductive pad. Static electricity on the jacket material of the cable induces a charge in the cable wires, which is bled to the pads via the dissipative medium. The charge on the pad is then grounded prior to or as the cable is connected to a cable jack.

19 Claims, 4 Drawing Sheets

CONNECTOR ASSEMBLY TO ELIMINATE OR REDUCE ESD ON HIGH-SPEED COMMUNICATION CABLES

BACKGROUND OF THE INVENTION

1. Field of the Invention

This invention relates generally to the art of electrical connectors, and more particularly to an electrical connector assembly which includes a means for eliminating electrostatic discharge of static electricity in high-speed communication cables resulting from turbocharging.

2. Description of Related Art

A general well-recognized problem frequently encountered in cable-connected modular electronic systems results from a build-up of electrostatic potential between different components and their connectors. Electrostatic discharge (ESD) in such systems has the potential for causing deleterious results such as system malfunction or failure. Electronic computer systems having integrated circuits are particularly sensitive to such electrostatic discharges Tribocharging is currently recognized as a significant problem in Local Area Networks (LANs). One popular networking option for connecting computers and equipment to LANs for high speed communication utilizes Unshielded Twisted Pair (UTP) cable and RJ45 connectors and jacks. Connections to a network are typically made to a female RJ45 jack by a male RJ45 connector. UTP cable typically consists of eight individually insulated, paired conducting wires which are collectively protected by a surrounding jacket. Each of the individual conducting wires has a terminal enclosed in an RJ45 connector or jack. Tribocharging is the buildup of static charge on the surface cable jacket during the reeling of the cable during installation or handling. Static charge on the charged jacket material of the cable having an attached RJ45 male connector induces a charge in the conductive wires of the cable which are in electrical contact with these terminal blades. When the charged RJ45 connector is inserted into the RJ45 jack, contact between the conductive terminals of the RJ45 connector and the conductive terminals of the RJ45 jack occurs, and electrostatic discharge to the LAN occurs. As mentioned previously, this discharge has the potential to damage sensitive components present in the network, and cause equipment malfunction and failure.

The problem of tribocharging went unrecognized until relatively recently because network failures were initially traced back to individual circuit packs containing integrated circuits sensitive to electrostatic discharge. Because the problem was solved by replacement of the circuit pack, system failures was attributed to manufacturing defects in the circuit packs.

A number of solutions for dealing with electrostatic discharge based on the general approach of providing a ground connection for an individual component or connector at risk have been proposed in the prior art, a number of representative examples of which follow. Biecher et al., in U.S. Pat. No. 5,478,253, describes an electrostatic discharge contact for blind mating connectors. Verdun, in U.S. Pat. No. 5,066,240, describes a high density electrical connector with electrostatic discharge protection. Northey and Sundy, in U.S. Pat. No. 5,409,387, disclose a connector with a passive switch for electrostatic discharge. St. Onge et al., in U.S. Pat. No. 4,814,698, discuss a technique for elimination of static in printed circuit board test fixtures. Other representative approaches are disclosed by Black et al., in U.S. Pat. No.

5,018,989 and Ziers, in U.S. Pat. No. 6,217,382. While effective, not all of these solutions are practical to implement in multiple component systems such as Local Area Networks because of cost and space constraints.

It is clear from the foregoing analysis that a serious need exists for a simple cost-effective space-saving connector assembly which eliminates or reduces the potential for electrostatic discharge (ESD) from high-speed communication cables. The present invention provides a solution to the problem not taught or suggested by the prior art.

SUMMARY OF THE INVENTION

Briefly described, the present invention comprises a connector assembly for removing static electricity generated in high-speed communication cable as a result of tribocharging. The present invention prevents damage to components such as integrated circuits which are sensitive to electrostatic discharge. The invention is realized with a high-speed cable having a connector with one or more conductive terminals, each of which terminates a conducting wire in the cable. In addition, the connector has one or more conductive pads, and a dissipative medium which electrically connects the terminals and pads. Static electricity on the jacket material of the cable induces a charge in the cable wire, which is bled from the terminals to the pads via the dissipative medium. A mating jack has a conductive pad electrically connected to ground for discharging the charge on the conducting pads of the connector before the terminals make electrical contact with matching terminals in the jack The invention may be more fully understood by reference to the following drawings.

DETAILED DESCRIPTION OF PREFERRED EMBODIMENT

During the course of this description like numbers will be used to identify like elements according to the different views that illustrate the invention.

Figure 1:
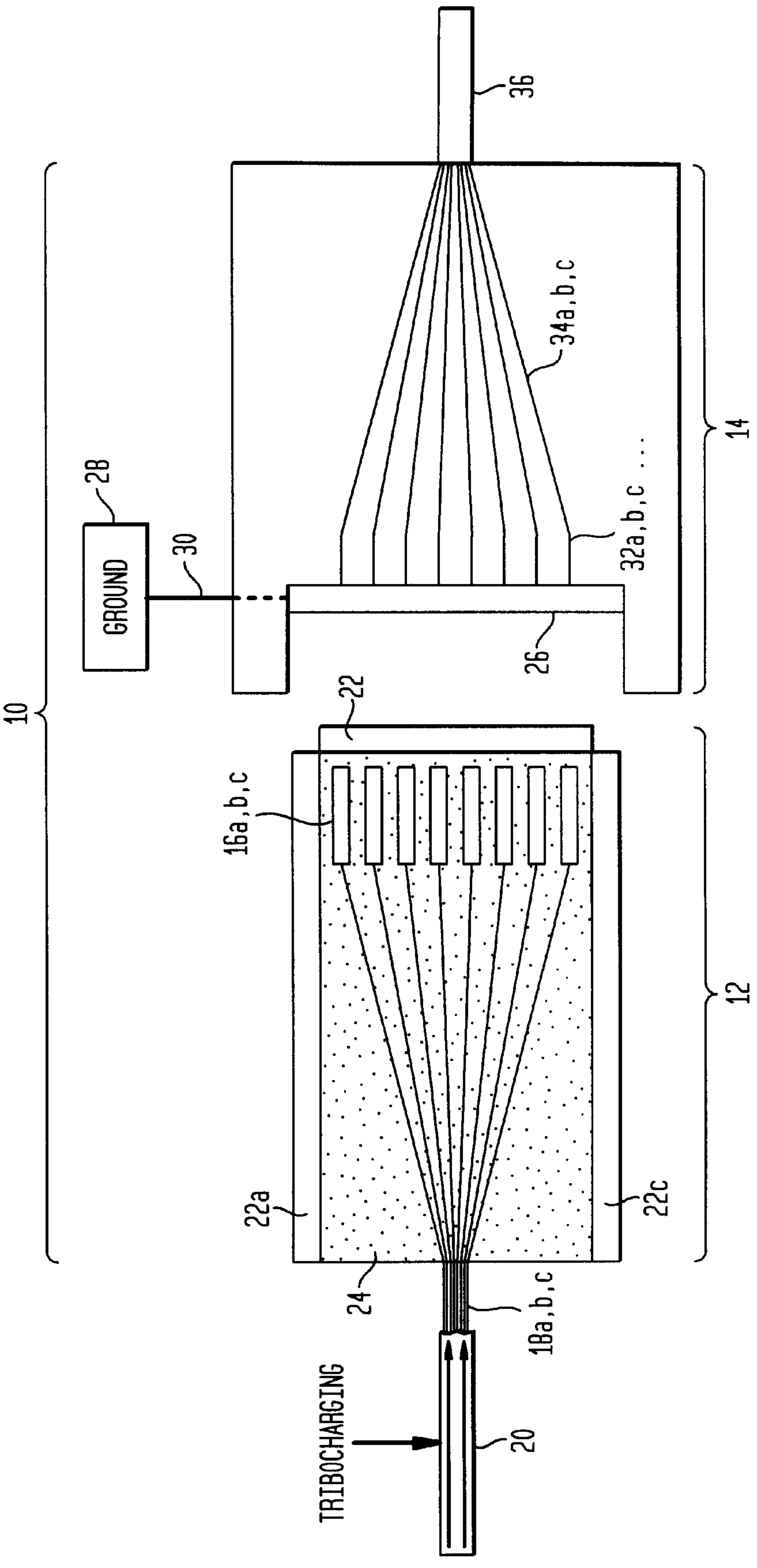
FIG. 1 illustrates the preferred embodiment of the present invention.

The preferred embodiment of the present invention is illustrated in FIG. 1. Connector assembly 10 has a connector 12 with means for dissipating static charge, and a jack 14 with means for discharging static charge. Connector 12 has conductive terminals 16*a,b,c* . . . which terminate each of the individual wires 18*a,b,c* . . . which comprise UTP cable 20. The connector 12 includes conductive pads 22*a–c*, which are electrically interconnected with conductive blades 16*a, b,c* . . . by dissipative medium 24.

Static electricity which builds up on the jacket material of UTP cable 20 through tribocharging induces a charge in the cable wires 18*a,b,c* . . . which terminate in connective terminals 16*a,b,c*. The charge is bled from the connective terminals 16*a,b,c* . . . to conducting pads 22*a–c* via dissipative medium 24.

Jack 14 has conductive pad 26, which is connected to ground 28 by ground wire 30. When connector 12 and matching jack 14 are connected, contact initially occurs between conductive pads 22*a–c* and 26, thereby discharging to ground any electrostatic charge built up on conductive pads 22*a–c* prior to contact between conducting terminals 16*a–c* and matching conducting terminals 34*a,b,c* . . . in jack 14. Discharge through jack wires 34*a.b.c* . . . of network cable 36 is thus prevented, and damage to sensitive components of the network is avoided.

Alternatively, static electricity built up on conductive pads 22*a–c* on connector 12 can be discharged by contact with a human operator attached to a grounding strap.

Figure 2:
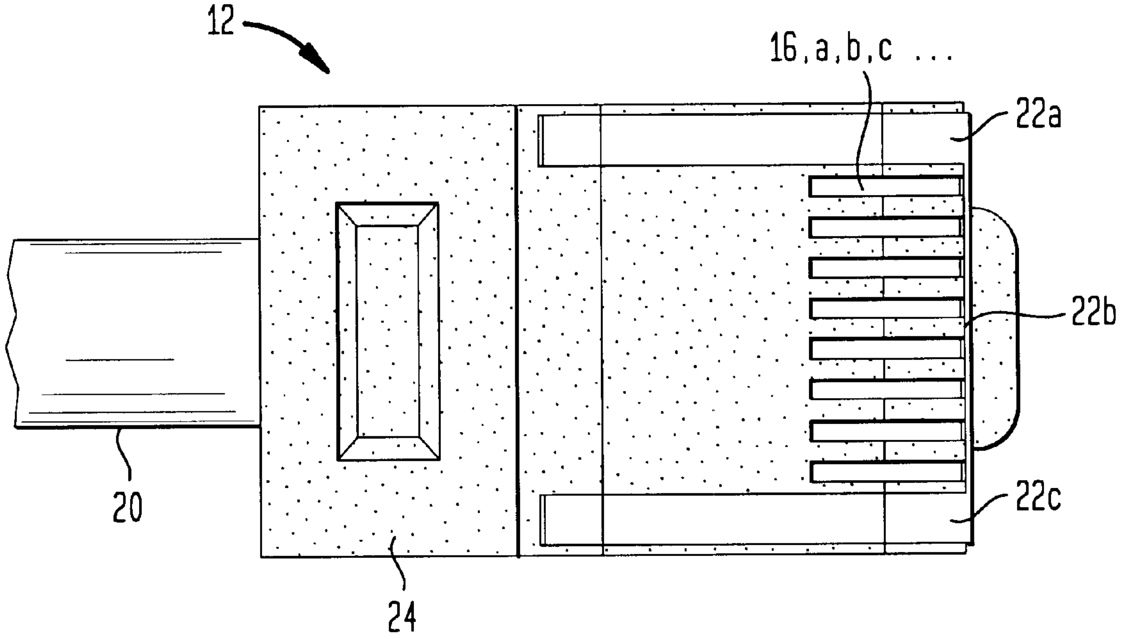
FIG. 2 illustrates the male connector of the embodiment of FIG. 1 in more detail.

FIG. 2 illustrates in more detail the two conductive pads 22*a* and 22*c* on the bottom of connector 12, and the conductive pad 22*b* on the front face of connector 12.

Figure 3:
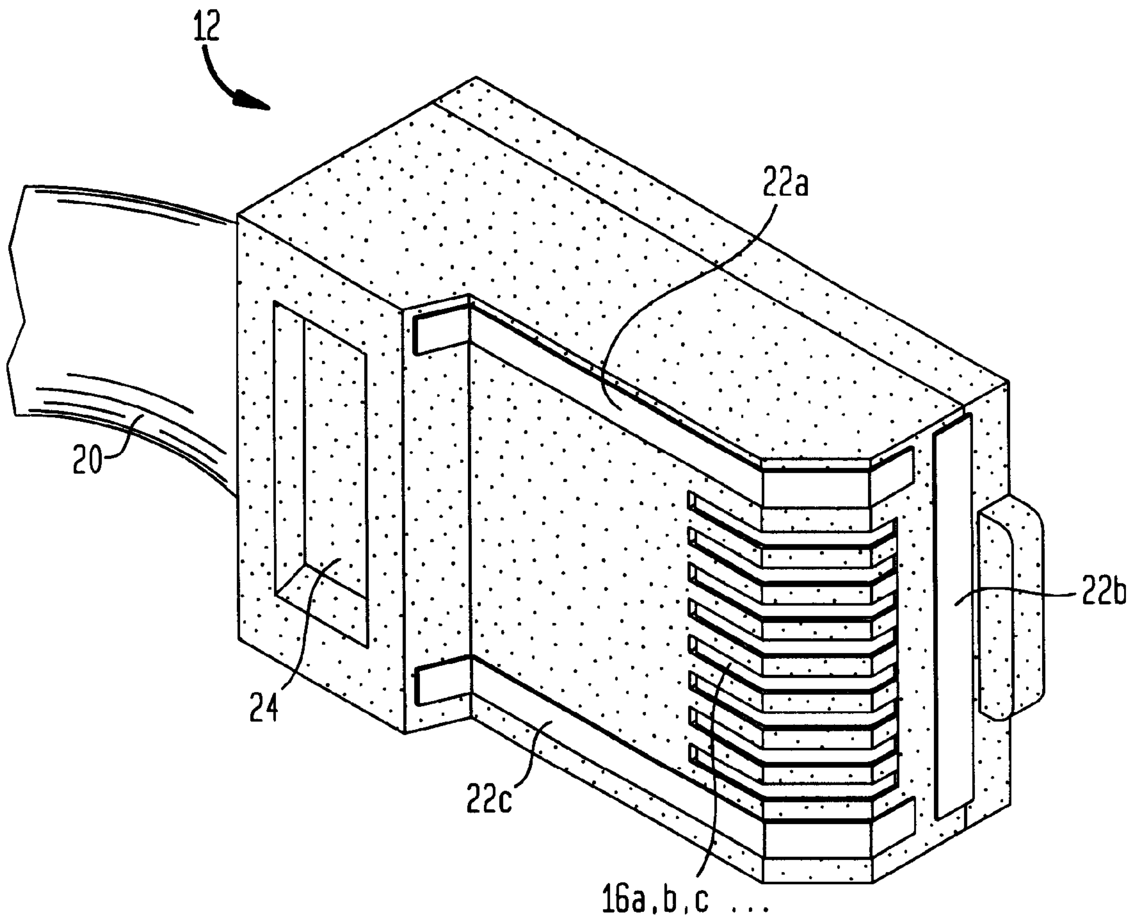
FIG. 3 is a perspective view of the connector of FIG. 2.

FIG. 3 is a perspective view of the connector of FIG. 2.

Figure 4:
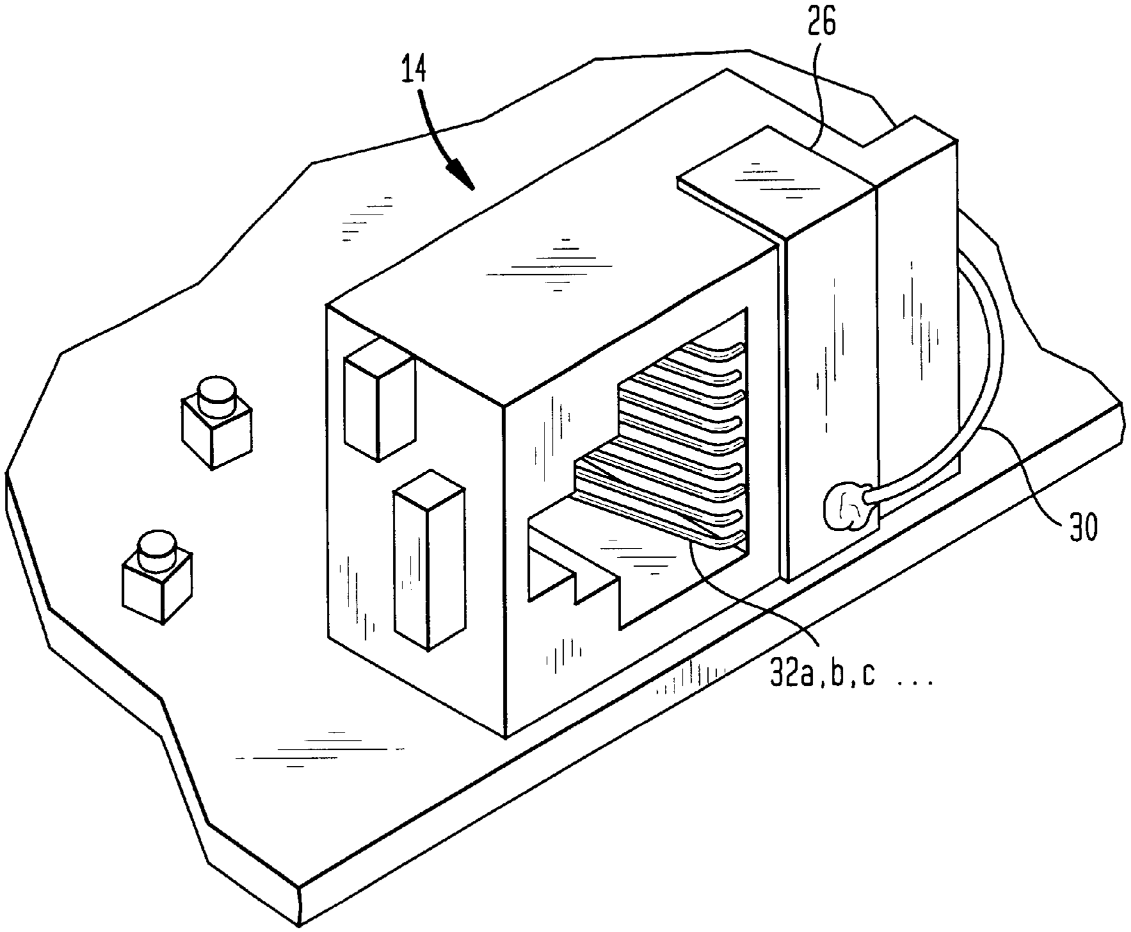
FIG. 4 illustrates the female connector of the embodiment of FIG. 1 in more detail.

FIG. 4 is a perspective view of the jack of FIG. 1 which matches the connector of FIG. 3, showing connective pad 26, and ground wire 30.

By definition a dissipative material has a resistivity in the range of $10^9$–$10^{11}$ ohms/square. The dissipative medium 24 can be a material applied to the entire surface of connector 12, or can be an integral component of the connector itself. The dissipative material may be applied to the surface of connector 12 by brushing, dipping or spraying the entire surface to provide a coating with a resistivity in the range of $10^9$–$10^{11}$ ohms/square. One type of material suitable for use in these coatings is an anti-static surfactant such as the ATI-1001 series of surfactants marketed by Aegis Technologies of Bridgton, Me.

Alternatively the dissipative material may be anti-static plastic resin which is molded, extruded and formed into connector 12.

Conductive pads 22*a–c* and 26 can be any material which has a surface resistance of less than 10 ohms/square. In actual practice, metal strips are fastened to the connector and jack with adhesive. Alternatively, a conductive paint can be applied to the connector or jack.

While the invention has been described with reference to a preferred embodiment thereof, it will be appreciated by those of ordinary skill in the art that modifications can be made to the structure and elements of the invention without departing from the spirit and scope of the invention as a whole.

What is claimed is:

1. An electrical connector assembly for removing static electricity generated in high-speed communication cable, said connector assembly comprising:

an electrical connector including:

one or more conductive first terminals, each of the one or more conductive first terminals being electrically interconnected to a wire in a first cable portion;

one or more conductive pads; and a dissipative medium having a resistance in the range of $10^9$ to $10^{11}$ ohms/square, and electrically connecting each of the one or more conductive first terminals with the one or more conductive pads, and an electrical jack for mating with said electrical connector, including:

one or more conductive second terminals, each of the one or more conductive second terminals being electrically interconnected to a wire in a second cable;

a conductive pad; and a wire connecting said conductive pad to ground, wherein said one or more conductive pads on said electrical connector are positioned to come into electrical contact with said conductive pad on said electrical jack before any of said one or more conductive first terminals come into electrical contact with said corresponding conductive second terminals in said jack when said electrical connector and said electrical jack are connected.

2. The connector assembly of claim 1, wherein said dissipative medium forms said connector.

3. The connector assembly of claim 1, wherein said one or more conducting pads are comprised of conducting metal strips applied to the surface of said connector.

4. The connector assembly of claim 1 wherein said one or more conducting pads are comprised of conductive paint.

5. The connector assembly of claim 1, wherein said dissipative medium is applied as a coating to the entire surface of said connector.

6. The connector assembly of claim 5, wherein said dissipative medium is an anti-static surfactant.

7. An electrical connector for dissipating static electricity generated in high-speed communication cable, said connector comprising:

one or more conductive terminals, each of the one or more conductive terminals being electrically interconnected to a wire in a cable;

one or more conductive pads; and a dissipative medium having a resistance in the range of $10^9$ to $10^{11}$ ohms/square, and electrically connecting each of the one or more conductive first terminals with the one or more conductive pads, wherein static electricity is transferred from said one or more conductive terminals to said one or more conductive pads by means of said dissipative medium.

8. The connector of claim 7, wherein said dissipative medium is applied as a coating to the entire surface of said connector.

9. The connector of claim 7, wherein said dissipative medium is an anti-static surfactant.

10. The connector of claim 7, wherein said dissipative medium forms said connector.

11. The connector of claim 7, wherein said one or more conducting pads are comprised of conducting metal strips applied to the surface of said connector.

12. The connector of claim 7 wherein said one or more conducting pads are comprised of conductive paint.

13. A first high speed communication cable comprising a means for dissipating static electricity so that said static electricity can be removed from said first cable by contact with a ground prior to electrical connection with a second high speed communication cable, said means for dissipating static electricity comprises a connector including:

one or more conductive first terminals, each of the one or more conductive first terminals being electrically interconnected to a wire in said first cable;

one or more conductive pads; and a dissipative medium having a resistance in the range of $10^9$ to $10^{11}$ ohms/square, and electrically connecting each of the one or more conductive first terminals with the one or more conductive pads;

wherein said one or more conductive pads on said electrical connector are positioned to come into electrical contact with ground prior to electrical contact with said second high speed communication cable.

14. The high speed communication cable of claim 13 wherein said ground is a human operator attached to a grounding strap.

15. The high speed communication cable of claim 13 wherein said ground is an electrical jack, including:

one or more conductive second terminals, each of the one or more conductive second terminals being electrically interconnected to a wire in said second cable;

a conductive pad; and a wire connecting said conductive pad to ground, wherein said conductive pad on said electrical jack is positioned to come into electrical contact with said one or more conductive pads in said electrical connector before any of said one or more conductive first terminals come into electrical contact with said corresponding conductive second terminals in said jack when said electrical connector and said electrical jack are connected.

16. The high speed communication cable of claim 15, wherein said dissipative medium forms said connector.

17. The high speed communication cable of claim 15, wherein said one or more conducting pads are comprised of conducting metal strips applied to the surface of said connector.

18. The high speed communication cable of claim 13, wherein said dissipative medium is applied as a coating to the entire surface of said connector.

19. The high speed communication cable of claim 18, wherein said dissipative medium is an anti-static surfactant.

* * * * *